(12) United States Patent
Lee

(10) Patent No.: US 7,803,504 B2
(45) Date of Patent: Sep. 28, 2010

(54) MASK PATTERN OF SEMICONDUCTOR DEVICE AND MANUFACTURING METHOD THEREOF

(75) Inventor: Jun Seok Lee, Goyang-si (KR)

(73) Assignee: Dongbu HiTek Co., Ltd., Seoul (KR)

(*) Notice: Subject to any disclaimer, the term of this patent is extended or adjusted under 35 U.S.C. 154(b) by 530 days.

(21) Appl. No.: 11/880,395

(22) Filed: Jul. 20, 2007

(65) Prior Publication Data
US 2008/0182181 A1    Jul. 31, 2008

(30) Foreign Application Priority Data
Jul. 21, 2006    (KR) .................. 10-2006-0068528

(51) Int. Cl.
*G03F 1/00* (2006.01)
(52) U.S. Cl. .................. 430/5; 430/311
(58) Field of Classification Search .......... 430/5, 430/30, 296, 311–313, 394; 438/253
See application file for complete search history.

(56) References Cited

U.S. PATENT DOCUMENTS

| | | | |
|---|---|---|---|
| 6,811,954 B1* | 11/2004 | Fukuda | 430/311 |
| 6,872,494 B2* | 3/2005 | Hoshino | 430/5 |
| 6,903,428 B2 | 6/2005 | Lee | |
| 7,147,975 B2 | 12/2006 | Misaka | |
| 7,569,312 B2 | 8/2009 | Misaka | |
| 2002/0042010 A1* | 4/2002 | Lin | 430/30 |
| 2004/0161678 A1 | 8/2004 | Misaka | |
| 2005/0255387 A1* | 11/2005 | Butt et al. | 430/5 |
| 2006/0019202 A1* | 1/2006 | Houston et al. | 430/313 |
| 2006/0110684 A1* | 5/2006 | Kim | 430/311 |
| 2006/0240342 A1* | 10/2006 | Tang | 430/5 |
| 2007/0141479 A1 | 6/2007 | Misaka | |
| 2007/0218627 A1* | 9/2007 | Lattard et al. | 438/253 |

FOREIGN PATENT DOCUMENTS

CN    1523639 A    8/2004

(Continued)

OTHER PUBLICATIONS

Akio Misaka; "Photomask, Pattern Formation Method Using Photomask and Mask Data Creation Method"; espacenet; Abstract of Chinese Publication No. CN1523639 (A); Publication Date: Aug. 25, 2004; espacenet Database—Worldwide.

(Continued)

*Primary Examiner*—Mark F Huff
*Assistant Examiner*—Stewart A Fraser
(74) *Attorney, Agent, or Firm*—The Law Offices of Andrew D. Fortney; Andrew D. Fortney

(57) ABSTRACT

Provided is a mask pattern of a semiconductor device. The mask pattern includes a plurality of main patterns and a plurality of assistance patterns. The main patterns are adjacent to one another. The assistance pattern is disposed on at least one of an end portion and a middle portion of each of the main patterns and has a line width greater than that of the main pattern. The assistance patterns are staggered.

20 Claims, 3 Drawing Sheets

FOREIGN PATENT DOCUMENTS

JP        11258770 A    9/1999

OTHER PUBLICATIONS

Toshiya Kotani, Satoshi Tanaka, Shoji Sanhongi and Soichi Inoue; "Mask Pattern Designing Method and Photomask"; espacenet; Absrtact of Japanese Publication No. JP11258770 (A); Publication Date: Sep. 24, 1999; espacenet Database—Worldwide, http://v3.espacenet.com/publicationDetails/biblio?DB=EPODOC&adja . . . .

Chinese Office Action dated Apr. 3, 2009; Chinese Patent Application No. 2007101391553; 2 pgs.; The State Intellectual Property Office of P.R.C., People's Republic of China.

* cited by examiner

# MASK PATTERN OF SEMICONDUCTOR DEVICE AND MANUFACTURING METHOD THEREOF

CROSS-REFERENCE TO RELATED APPLICATIONS

The present application claims priority under 35 U.S.C. 119 and 35 U.S.C. 365 to Korean Patent Application No. 10-2006-0068528 (filed on Jul. 21, 2006), which is hereby incorporated by reference in its entirety.

BACKGROUND

The technology of manufacturing a mask pattern greatly affects the accuracy of a pattern formed on the semiconductor substrate.

Especially, if optical proximity effect of the mask pattern is not appropriately considered, the line width of the pattern is distorted during a photo lithography process, causing the linearity of the critical dimension to be short.

In addition, as a semiconductor device is miniaturized, the pattern is damaged by the optical proximity effect related to adjacent patterns during the photo lithography process.

Hence, various methods, which minimize the distortion phenomenon of light, such as optical proximity correction (OPC) and phase shifting mask technologies are being employed. The OPC technology compensates for the problem of light diffraction using a pattern, and the phase shifting mask technology improves an optical contrast to enhance the resolution.

Although the various methods are employed, the resolution problem of fine line widths is not easily solved. As a result, a photoresist layer pattern is chemically and physically stressed during the photo lithography process. The capillary phenomenon generated during a development process is a representative example. The greater the aspect ratio of the height to the width of the pattern, for resolution, and the fineness of a line width pitch, the greater the capillary phenomenon causing pattern collapse phenomenon during development, washing, and drying processes.

SUMMARY

Embodiments provide a mask pattern of a semiconductor device can prevent pattern collapse phenomenon of a portion of the mask pattern having fine line widths and a manufacturing method thereof.

In one embodiment, a mask pattern of a semiconductor device includes: a plurality of main patterns adjacent to one another; and an assistance pattern on at least one of an end portion and a middle portion of each of the main patterns, the assistance pattern having a line width greater than that of the main pattern, wherein the assistance patterns are staggered.

In another embodiment, a method of manufacturing a mask pattern of a semiconductor device includes: forming a plurality of adjacent main patterns; forming an assistance pattern on at least one of an end portion and a middle portion of each of the main patterns, the assistance pattern having a line width greater than that of the main pattern.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings.

Before the embodiments are described, the principal of pattern collapse phenomenon will now be described.

Figure 1:
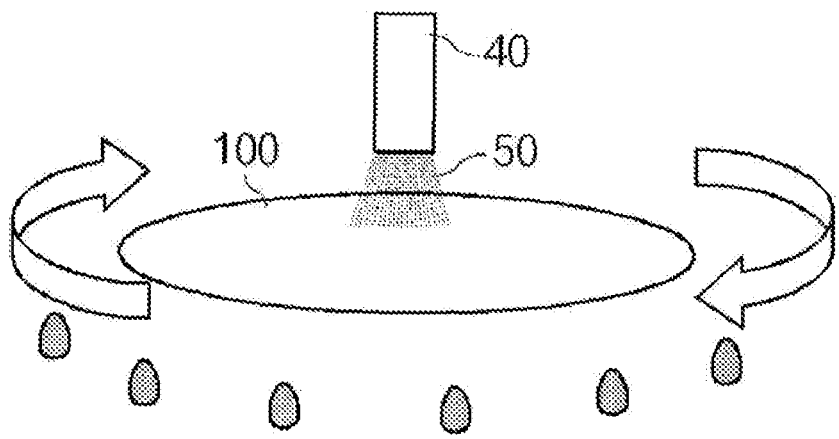
FIG. 1 is a view illustrating a development process of a photoresist layer.
Figure 2:
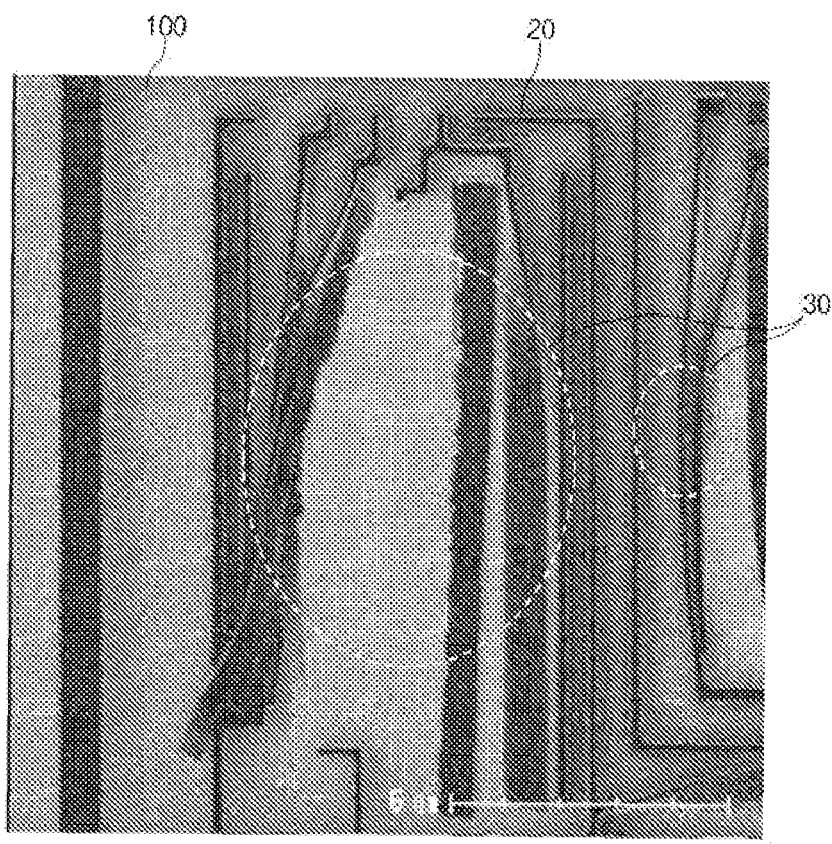
FIG. 2 is an image illustrating pattern collapse phenomenon of a photoresist layer.

FIG. 1 is a view illustrating a development process of a photoresist layer, and FIG. 2 is an image illustrating the pattern collapse phenomenon of a photoresist layer.

Referring to FIG. 1, developer (not shown) is sprayed on a semiconductor substrate 100 through a nozzle 40 of a development unit (not shown), and the photoresist layer is then developed to obtain a photoresist layer pattern (not shown) of the semiconductor substrate 100.

Thereafter, through the nozzle 40, deionized water 50 is sprayed to wash the photoresist layer pattern of the semiconductor substrate 100.

After the washed semiconductor substrate 100 is dried, the photoresist layer pattern formed on the semiconductor substrate 100 is observed using a scanning electron microscope (SEM) to obtain the image as illustrated in FIG. 2.

Referring to FIG. 2, the photoresist layer pattern of the semiconductor substrate 100 includes a normal pattern portion 20 and a collapsed pattern portion 30 due to the capillary phenomenon during a patterning process. As such, the pattern collapse phenomenon easily occurs when a fine pattern is formed on a metal substrate, when the aspect ratio of the height to the width of a pattern is 3 or more, and when a pattern is asymmetric.

Figure 3:
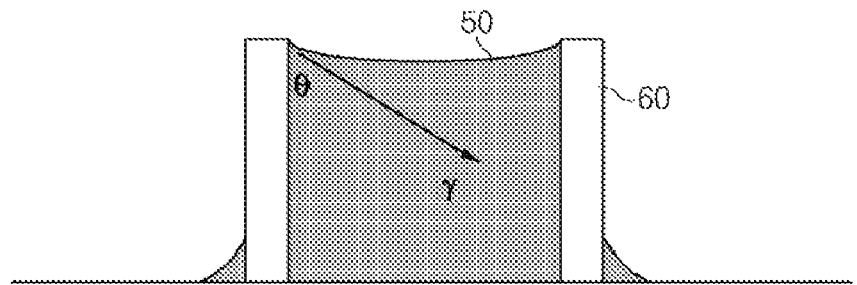
FIG. 3 is a view illustrating the state of deionized water contacting a photoresist layer pattern during a development process.
Figure 4:
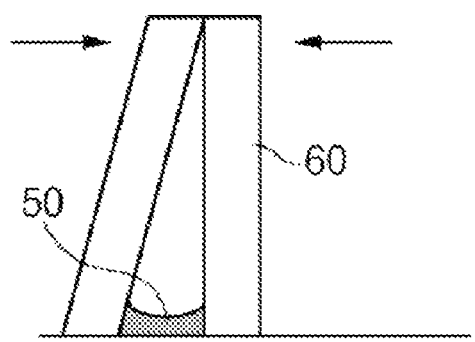
FIG. 4 is a view illustrating the shape of a photoresist layer pattern after deionized water is dried.

FIG. 3 is a view illustrating the state of deionized water 50 contacting a photoresist layer pattern 60 during a development process, and FIG. 4 is a view illustrating the shape of the photoresist layer pattern 60 after the deionized water is dried.

Referring to FIG. 3, when the gap between portions of the photoresist layer pattern 60 is narrower, the meniscus of the deionized water 50 in the narrow gap is higher than that of deionized water in a wider gap.

In addition, because of the force difference between the narrower gap and the wider gap, a force γ having an angle θ is transmitted toward the narrow gap.

The transmitted force is a capillary force caused by the capillary phenomenon of the deionized water 50. The transmitted force is generated during a drying process of the semiconductor substrate 100 as illustrated in FIG. 2. Referring to FIG. 4, while the deionized water 50 is gradually evaporated, the photoresist layer pattern 60 is collapsed toward the direction of the transmitted force.

Therefore, the pattern collapse phenomenon as illustrated in FIG. 2 occurs.

Figure 5:
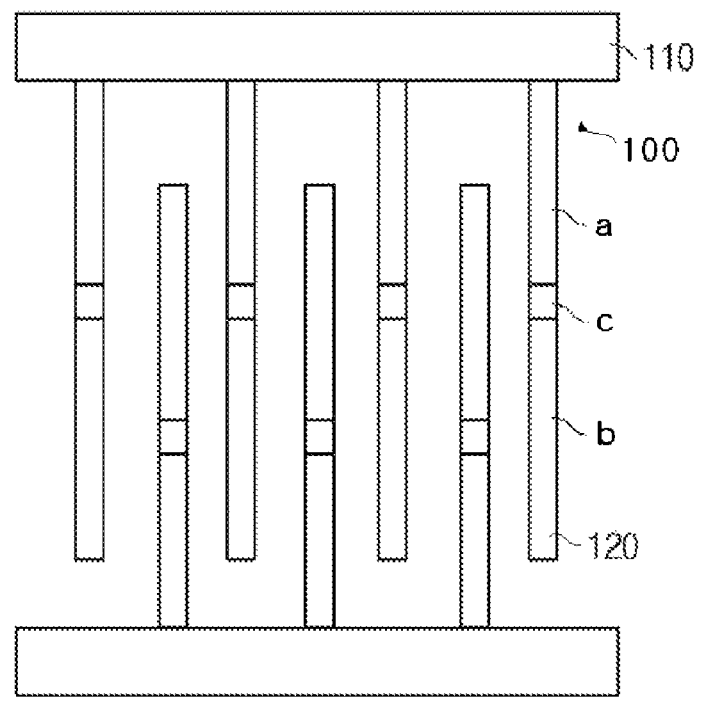
FIGS. 5 to 7 are views illustrating a method of manufacturing a mask pattern according to an embodiment.
Figure 6:
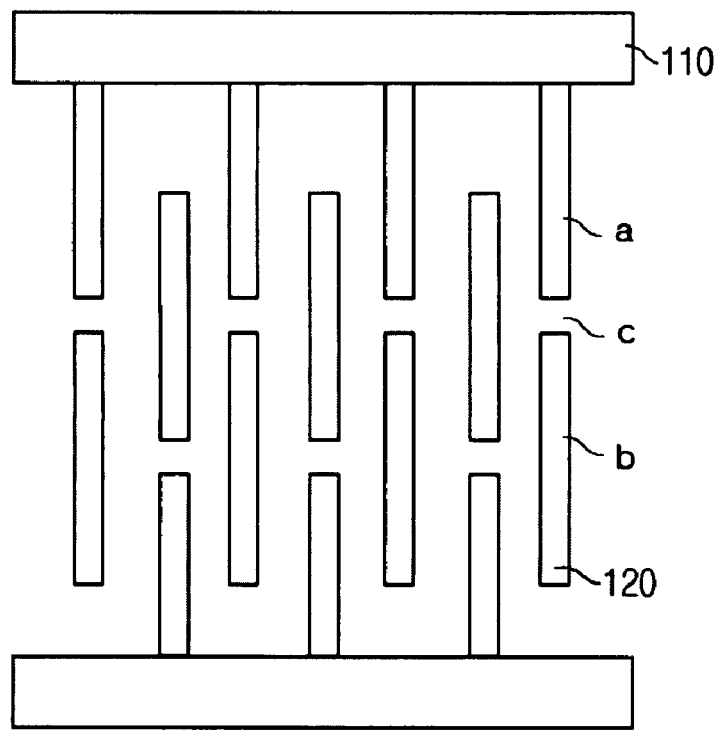
Figure 7:
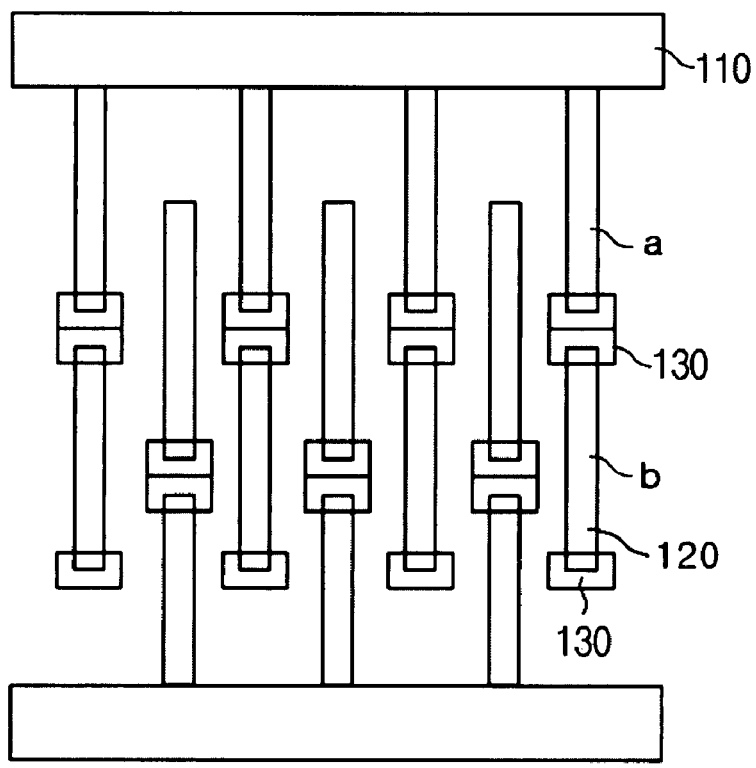

FIGS. 5 to 7 are views illustrating a method of manufacturing a mask pattern according to an embodiment of the invention. The present invention applies to both photolithography masks (e.g., a pattern of chrome formed on a quartz plate, through which light of a predetermined wavelength is passed to cause a photochemical reaction in irradiated portions of a photoresist on a semiconductor substrate and thus transfer a layout pattern to the photoresist) and etch masks (e.g., the patterned photoresist on the semiconductor substrate). The material to be patterned using the mask can be any conventionally patterned material, but preferably comprises a metal, polysilicon, metal silicide or insulator (preferably metal or polysilicon).

Referring to FIG. 5, the mask pattern according to the embodiment includes a plurality of main patterns 100. The main pattern 100 includes a first pattern 110 and a plurality of second patterns 120.

The first pattern 110 has a line width greater than the minimum line width according to a design rule of the mask pattern and has a feature capable of connecting the second patterns 120. In general, a plurality of adjacent first patterns 110 are parallel to one another. In some embodiments, 3, 4, 5, 6 or more adjacent first patterns 110 are parallel to one another (or have predetermined length portions that are parallel to one another, the predetermined length being at least 3, 5 or 10 times the width of the first patterns 110).

The second pattern 120 has a line width less than the minimum line width and extends from the first pattern 110 (generally, substantially perpendicular to the first pattern 110). Hence, the line width of the first pattern 110 is greater than that of the second pattern 120. In general, each first pattern 110 has a plurality of second patterns 120 in contact therewith and extending therefrom Also, in the case where the plurality of main patterns 100 are provided, the first patterns 110 of the main patterns 100 may face each other (or be parallel to each other), and the second patterns 120 of the main patterns 100 may be staggered, as illustrated in FIG. 5 (e.g., a plurality of the second patterns 120 extending from a first first pattern 110 may be interleaved with a plurality of second patterns 120 extending from a second first pattern 110).

As such, the method of manufacturing the mask pattern according to the embodiment may reduce or prevent the pattern collapse phenomenon of a photoresist layer easily occurring in a pattern region in which the adjacent main patterns 100 are designed, that is, in a condensed pattern region.

First, as shown in FIG. 6, a middle portion of the second pattern 120 is "cut," and cut second patterns a and b are overlapped with each other (e.g., a second pattern 120 extending from a first first pattern 110 may have a cut region c a first predetermined distance from the first first pattern 110 and a second predetermined distance from an adjacent second first pattern 110, the second predetermined distance>the first predetermined distance; preferably, all of the second patterns 120 between adjacent parallel first patterns 110 have such a "cut" region c). The "cut" region c is generally not actually cut or removed from an actual photolithography or photoresist mask, except in an electronic representation of the mask. Rather, the "cut" region c is described in the electronic representation of the mask to facilitate insertion of as assistance pattern (to be described below).

An overlapped portion c is thus generally formed at only the second pattern 120 having a line width less than the minimum line width. In addition, the overlapped portion c has a length larger than or equal to a predetermined threshold length (e.g., the minimum length causing an offgrid, for example, 2 nm or more).

Thereafter, referring again to FIG. 6, the size of the (overlapped) portion c may be reduced through a precise adjustment process, which may be optical, chemical and/or electrical, in accordance with techniques known to those skilled in the art. The reduction range of the overlapped portion c may be 1-2 nm.

After the size of the (overlapped) portion c is adjusted, referring to FIG. 7, a plurality of assistance patterns 130 are formed at the portion c and/or at an end portion of the second pattern 120. The assistance pattern 130 is generally tetragonal, has a line width greater than that of the second pattern 120, and covers (alone or with a counterpart assistance pattern 130 over a remaining part of portion c) the portion c. In other words, each of a plurality of assistance patterns 130 may be placed at ends of each second pattern 120, and each of the assistance patterns 130 may have dimensions sufficient to cover the "cut" portion c in the second pattern 120.

Hence, as described in FIG. 5, in the case where the second patterns 120 of the main patterns 100 are staggered, if the overlapped portions c along the plurality of second patterns 120 extending from a particular first pattern 110 are arranged on a horizontal line, the adjacent assistance patterns 130 overlap with one another. To prevent the overlaps of the assistance patterns 130 having line widths relatively greater than those of the second patterns 120, the adjacent overlapped portions c are out of a horizontal line to be staggered. The arrangement in which the "cut" portions c are a first predetermined distance from the first first pattern 110 and a second predetermined distance from an adjacent second first pattern 110 results in staggered assistance patterns 130 along adjacent second patterns 120 (extending from adjacent parallel first and second first patterns 110).

As such, the area of the second pattern 120 can be expanded by the assistance pattern 130. Hence, when the photoresist layer is exposed and developed using the mask pattern, a portion of the photoresist layer formed using the assistance pattern 130 fixes or stabilizes a portion of the photoresist layer including the second pattern 120. Therefore, the pattern collapse phenomenon is reduced. Although not wishing to be bound by any particular theory, it is believed that (1) forming second patterns 120 having line widths less than a minimum line width (or critical dimension [CD]) and (2) forming assistance patterns 130 at the ends of the second pattern 120 on a photolithography mask may result in relatively small corresponding structures in the patterned photoresist mask, which may be sufficient to stabilize the patterned photoresist mask against collapse due to the capillary phenomenon, but insufficient to result in formation o any corresponding pattern in the underlying material (e.g., a relatively standard or slightly extended overetch can remove the residual second patterns and/or assistance patterns in the photoresist mask).

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A mask pattern, the mask pattern comprising:
   a plurality of main patterns adjacent to one another, each comprising a first pattern and a plurality of second patterns extending perpendicularly from the first pattern, wherein each of the second patterns has a line width less than a line width of the first pattern; and
   one or more staggered assistance patterns on each of the second patterns, the assistance patterns having a line width greater than the line width of the second patterns.

2. The mask pattern according to claim 1, wherein the first patterns are parallel, and the second patterns are staggered relative to second patterns of an adjacent first pattern.

3. The mask pattern according to claim 1, wherein a ratio of a height of the first patterns to the width of the first patterns is three or more.

4. A method of manufacturing a mask pattern, the method comprising:
   forming a plurality of main patterns adjacent to one another, each comprising a first pattern and a plurality of second patterns extending perpendicularly from the first pattern, wherein the second patterns have a line width less than a line width of the first pattern; and
   forming one or more staggered assistance patterns on each of the second patterns, the assistance patterns having a line width greater than the line width of the second patterns.

5. The method according to claim 4, wherein the first patterns are parallel, and the second patterns are staggered relative to second patterns of an adjacent first pattern.

6. The method according to claim 4, wherein forming the main patterns comprises:
   cutting a middle portion of the each second pattern to form overlapped portions of the second patterns; and
   adjusting a size of the overlapped portions of the cut second patterns,
   wherein forming the assistance patterns comprises forming the assistance patterns at the overlapped portions.

7. The method according to claim 6, further comprising cutting each second pattern to create a plurality of ends in each second pattern.

8. The method according to claim 4, wherein a ratio of a height of the first patterns to the width of the first patterns is three or more.

9. The mask pattern according to claim 2, wherein the second patterns extending from one first pattern are interleaved with the second patterns extending from another first pattern.

10. The mask pattern according to claim 1, wherein the assistance patterns are located a first predetermined distance from one first pattern and a second predetermined distance from an adjacent first pattern.

11. The mask pattern according to claim 1, wherein the assistance patterns are tetragonal.

12. The mask pattern according to claim 1, wherein the assistance patterns cover the ends of the second patterns opposite the first pattern from which the assistance patterns extend.

13. The method according to claim 6, wherein the overlapped portions are a first predetermined distance from one first pattern and a second predetermined distance from an adjacent first pattern.

14. The method according to claim 5, wherein a plurality of second patterns extending from one first pattern is interleaved with a plurality of second patterns extending from another first pattern.

15. The method according to claim 4, wherein the assistance patterns are tetragonal.

16. The method according to claim 6, wherein the assistance patterns cover the overlapped portions.

17. The method according to claim 4, wherein the assistance patterns cover the ends of the second patterns opposite the first pattern from which they extend.

18. The method according to claim 6, wherein adjusting a size of the overlapped portions comprises reducing a size of the overlapped portions.

19. The method according to claim 18, wherein said size is reduced by 1 to 2 nm.

20. The mask pattern according to claim 1, comprising a plurality of staggered assistance patterns on each of the second patterns.

* * * * *